United States Patent [19]
Lee et al.

[11] Patent Number: 5,687,121
[45] Date of Patent: Nov. 11, 1997

[54] FLASH EEPROM WORLDLINE DECODER

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[21] Appl. No.: 645,630

[22] Filed: May 14, 1996

Related U.S. Application Data

[63] Continuation-in-part of Ser. No. 624,322, Mar. 29, 1996.

[51] Int. Cl.$^6$ .................................................. G11C 16/00
[52] U.S. Cl. ........................... 365/185.11; 365/185.23; 365/185.33; 365/230.06
[58] Field of Search ................... 365/185.11, 185.23, 365/185.33, 189.05, 189.01, 230.06, 230.03

[56] References Cited

U.S. PATENT DOCUMENTS

| | | | |
|---|---|---|---|
| 3,740,730 | 6/1973 | Ho et al. | 365/230.06 |
| 4,698,787 | 10/1987 | Mukherjee et al. | 365/185 |
| 4,949,309 | 8/1990 | Rao | 365/218 |
| 5,023,835 | 6/1991 | Huimoto et al. | 365/189.03 |
| 5,097,444 | 3/1992 | Fong | 365/185 |
| 5,109,361 | 4/1992 | Yim et al. | 365/218 |
| 5,185,718 | 2/1993 | Rinerson et al. | 365/185 |
| 5,191,556 | 3/1993 | Radjy | 365/235 |
| 5,235,545 | 8/1993 | McLaury | 365/230.06 |
| 5,394,373 | 2/1995 | Kawamoto | 365/189.05 |
| 5,396,459 | 3/1995 | Arakawa | 365/185 |
| 5,455,789 | 10/1995 | Nakamura et al. | 365/185.23 |
| 5,511,034 | 4/1996 | Hirata | 365/189.05 |

*Primary Examiner*—Tan T. Nguyen
*Attorney, Agent, or Firm*—Flehr Hohbach Test Albritton & Herbert LLP

[57] ABSTRACT

A flash memory wordline decoder includes a plurality of voltage terminals to receive a plurality of voltages, a plurality of address terminals to receive a plurality of address signals, a procedure terminal to receive a procedure signal, and a plurality of output wordlines adapted to be coupled to a bank of flash transistors. The wordline decoder circuit is configured to decode the address signals and includes latches coupled to the wordlines, where the latches are configured to latch the wordlines and to provide an operational voltage on the wordline to accomplish a predetermined operation responsive to the procedure signal. Advantages of the invention include a verification with a low verification voltage such as 1 V or less for operating with a VDD supply voltage as low as 1.5 V. The decoder also reduces erase/write cycle time and improves expected lifetime of the flash memory due to reduced stress on the flash transistors within the flash memory.

36 Claims, 20 Drawing Sheets

| | | ERASE | ERSVFY | PROGRAM | PGMVFY | READ |
|---|---|---|---|---|---|---|
| SELECT 1/2/MULT | PRESET | 0/5/0 | X | 5/0/0 | X | X |
| | | 0/0/5 | 0/0/0 | 5/0/0 | 0/0/5 | 0/5/0 |
| MODE1 | | 5 | 5 | 0 | 1 | 5 |
| MODE2 | | 0 | 0 | 5 | 0 | 0 |
| VPP | | 5->10 | 6 | 5->0 | 1 | 5 |
| VPN | | 0 | 0 | 0->-5->-10 | 0 | 0 |
| ISO | | 5 | 5 | 5->0->-10 | 5 | 5 |
| TN | PRESET | 5/5 | X | 5/5 | X | X |
| | | 5/0->0/0 | 0/0 | 5/0->0/0 | 5/0 | 5/0 |
| TNB | PRESET | 0/0 | X | 0/0 | X | X |
| | | 0/5->0/0 | 0/0 | 0/5->0/0 | 5/0 | 5/0 |
| WL | PRESET | 0/0 | X | 5/5 | X | X |
| | | 5/0->10/0 | 6/0 | 0/5->-10/0 | 1/0 | 5/0 |

TABLE 2

R-PREDECODER

S-PREDECODER

|  | T0 | T0B | S1 | S2 | S3 |
|---|---|---|---|---|---|
| 1) READ OPERATION | N1 | N1B | L | L | L |
| 2) MODEB INITIALIZATIO | L | H | L | H | L |
| 3) ALLB INITIALIZATION | L | H | H | L | H |
| 4) MULTIPLE-SELECTION | N1 | L | L | L | H |
| 5) ISOLATION | L | L | H | H | H |

| | | ERASE | ERSVFY | PROGRAM | PGMVFY | READ |
|---|---|---|---|---|---|---|
| SELECT 1/2/MULT | PRESET | 0/5/0 | X | 5/0/0 | X | X |
| | | 0/0/5 | 0/0/0 | 5/0/0 | 0/0/5 | 0/5/0 |
| MODE1 | | 5 | 5 | 0 | 1 | 5 |
| MODE2 | | 0 | 0 | 5 | 0 | 0 |
| VPP | | 5->10 | 6 | 5->0 | 1 | 5 |
| VPN | | 0 | 0 | 0->-5->-10 | 0 | 0 |
| ISO | | 5 | 5 | 5->0->-10 | 5 | 5 |
| TN | PRESET | 5/5 | X | 5/5 | X | X |
| | | 5/0->0/0 | 0/0 | 5/0->0/0 | 5/0 | 5/0 |
| TNB | PRESET | 0/0 | X | 0/0 | X | X |
| | | 0/5->0/0 | 0/0 | 0/5->0/0 | 5/0 | 5/0 |
| WL | PRESET | 0/0 | X | 5/5 | X | X |
| | | 5/0->10/0 | 6/0 | 0/5->-10/0 | 1/0 | 5/0 |

TABLE 2

| | | ERASE | ERSVFY | PROGRAM | PGMVFY | READ |
|---|---|---|---|---|---|---|
| SELECT 1/2/MULT | PRESET | 0/5/0 | X | 5/0/0 | X | X |
| | | 0/0/5 | 0/0/0 | 5/0/0 | 0/0/5 | 0/5/0 |
| MODE1 | | 5 | 5 | 0 | 1 | 5 |
| MODE2 | | 0 | 0 | 5 | 0 | 0 |
| VPP | | 5->10 | 6 | 5->0 | 1 | 5 |
| VPN | | 0 | 0 | 0->-5->-10 | 0 | 0 |
| ISO | | 0 | 0 | 5->0->-10 | 5 | 5 |
| TN | PRESET | 5/5 | X | 5/5 | X | X |
| | | 5/0->0/0 | 0/0 | 5/0->0/0->-10/-10 | 5/-2 | 5/0 |
| TNB | PRESET | 0/0 | X | 0/0 | X | X |
| | | 0/5->0/0 | 0/0 | 0/5->0/0 | 5/0 | 5/0 |
| WL | PRESET | 0/0 | X | 5/5 | X | X |
| | | 5/0->10/0 | 6/0 | 0/5->-10/0 | 1/0 | 5/0 |

TABLE 4

| | ERASE | | PROGRAM | | READ |
|---|---|---|---|---|---|
| PROTECT | 0(YES) | 5(NO) | 0(YES) | 5(NO) | X |
| SELECT 1/2/MULT | 0/0/5 | 0/0/5 | 5/0/0 | 5/0/0 | 0/5/0 |
| MODE1 | 5 | 5 | 0 | 0 | 5 |
| MODE2 | 0 | 0 | 5 | 5 | 0 |
| VPP | 5->10 | 5->10 | 5->0 | 5->0 | 5 |
| VPN | 0 | 0 | 0->-5->-10 | 0->-5->-10 | 0 |
| ISO | 5 | 5 | 5->0->-10 | 5->0->-10 | 5 |
| TN | 5/0->0/0 | 5/0->0/0 | 5/0->0/0 | 5/0->0/0 | 5/0 |
| TNB | 0/5->0/0 | 0/5->0/0 | 0/5->0/0 | 0/5->0/0 | 5/0 |
| WL | 0->0 | 5/0->10/0 | 5->0 | 0/5->-10/0 | 5/0 |

TABLE 5

| | ERASE | ERSVFY | PROGRAM | PGMVFY | READ |
|---|---|---|---|---|---|
| SELECT 1/2/MULT | 0/0/5 | 0/0/0 | 5/0/0 | 0/0/5 | 0/5/0 |
| MODE1 | 5 | X | 0 | 1 | 5 |
| MODE2 | 0 | X | 5 | 0 | 0 |
| VPP | 5->10 | 6 | 5->0 | 1 | 5 |
| VPN | 0 | 0 | 0->-5->-10 | 0 | 0 |
| VPL | 7 | 5 | 7 | 5 | 5 |
| ISO | 5 | 5 | 5->0->-10 | 5 | 5 |
| TN | 5/0->0/0 | 0/0 | 5/0->0/0 | 5/0 | 5/0 |
| TNB | 0/5->0/0 | 0/0 | 0/5->0/0 | 5/0 | 5/0 |
| SG | 7/0 | 5/0 | 7/0 | 5/0 | 5/0 |
| WL | 5/0->10/0 | 6/0 | 0/5->-10/0 | 5/0 | 5/0 |

| | ERASE | | PROGRAM | | READ |
|---|---|---|---|---|---|
| PROTECT | 0(YES) | 5(NO) | 0(YES) | 5(NO) | X |
| SELECT 1/2/MUL | 0/0/5 | 0/0/5 | 5/0/0 | 5/0/0 | 0/5/0 |
| MODE1 | 5 | 5 | 0 | 0 | 5 |
| MODE2 | 0 | 0 | 5 | 5 | 0 |
| VPP | 5->10 | 5->10 | 5->0 | 5->0 | 5 |
| VPN | 0 | 0 | 0->-5->-10 | 0->-5->-10 | 0 |
| ISO | 5 | 5 | 5->0->-10 | 5->0->-10 | 5 |
| TN | 5/0->0/0 | 5/0->0/0 | 5/0->0/0 | 5/0->0/0 | 5/0 |
| TNB | 0/5->0/0 | 0/5->0/0 | 0/5->0/0 | 0/5->0/0 | 5/0 |
| WL | 0->0 | 5/0->10/0 | 5->0 | 0/5->-10/0 | 5/0 |
| VPL | 7 | 7 | 7 | 7 | 5 |
| SG | 7/0 | 7/0 | 7/0 | 7/0 | 5/0 |

Fig. 15

| Fig. 15A |
|----------|
| Fig. 15B |

Fig. 15A (1) ERASE

| | SELECT 1/2/MULT | | MODE1 | MODE2 | VPP | VPN | ISO | TN | | TNB | | WL | |
|---|---|---|---|---|---|---|---|---|---|---|---|---|---|
| | PRE-SET* | | | | | | | PRE-SET* | | PRE-SET* | | PRE-SET* | |
| SINGLE WL ERASE | N/A | 0/5/0 | X | 0 | 5->10 | 0 | 5 | N/A | 5/0->0/0 | N/A | 0/5->0/0 | N/A | 5/0->10/0 |
| MULTIPLE WL ERASE | 0/5/0 | 0/0/5 | 5 | 0 | 5->10 | 0 | 5 | 5/5 | 5/0->0/0 | 0/0 | 0/5->0/0 | 0/0 | 5/0->10/0 |
| WHOLE CHIP ERASE | 5/0/0 | N/A | X | X | 5->10 | 0 | 5 | 5/5 | ->0/0 | 0/0 | N/A | 5/5 | ->10/10 |

(2) ERASE-VERIFY

| | | | | | | | | | | | | | |
|---|---|---|---|---|---|---|---|---|---|---|---|---|---|
| ERSVFY | N/A | 0/0/0 | 5 | 0 | 6 | 0 | 5 | N/A | 0/0 | N/A | 0/0 | N/A | 6/0 |

(3) PROGRAM

| | | | | | | | | | | |
|---|---|---|---|---|---|---|---|---|---|---|
| SINGLE WL PROGRAM | N/A | 5/0/0 | X | 5 | 5→0 | 0→-5 →-10 | 5→0 →-10 | N/A | 5/0→0/0 | N/A | 0/5→0/0 | N/A | 0/5→-10/0 |
| MULTIPLE WL PROGRAM | 5/0/0 | 5/0/0 | 0 | 5 | 5→0 | 0→-5 →-10 | 5→0 →-10 | 5/5 | 5/0→0/0 | 0/0 | 0/5→0/0 | 5/5 | 0/5→-10/0 |
| WHOLE CHIP PROGRAM | 0/5/0 | N/A | X | X | 5→0 | 0→-5 →-10 | 5→0 →-10 | 5/5 | →0/0 | 0/0 | N/A | 0/0 | →-10/-10 |

(4) PROGRAM-VERIFY

| | | | | | | | |
|---|---|---|---|---|---|---|---|
| PGMVFY | N/A | 0/0/5 | 1 | 0 | 1 | 0 | N/A | 5/0 | N/A | 0/5 | N/A | 1/0 |

(5) READ

| | | | | | | | |
|---|---|---|---|---|---|---|---|
| N-CH CELL READ | N/A | 0/5/0 | X | 0 | 5 | 0 | N/A | 5/0 | N/A | 0/5 | N/A | 5/0 |
| P-CH CELL READ | N/A | 5/0/0 | X | 5 | 5 | 0 | N/A | 5/0 | N/A | 0/5 | N/A | 0/5 |

Fig. 15B

FLASH EEPROM WORLDLINE DECODER

RELATED APPLICATIONS

The present patent application is a continuation in part of U.S. patent application Ser. No. 08/624,322 filed on Mar. 29, 1996, and incorporates the parent case by reference.

FIELD

The present invention relates to a flash electrically erasable programmable read only memory (EEPROM) wordline decoder. In particular, the flash EEPROM wordline decoder provides a latch function that permits multiple wordlines to be set to a predetermined state in order to execute a predetermined operation.

BACKGROUND

Flash memories are becoming increasingly popular because they can store information in the absence of continuous power and they can be constructed in compact form. In essence, a flash memory is an electrically erasable programmable read only memories (EEPROM) that supports three operations: read, program and erase. For a detailed description of flash-type transistors, see U.S. Pat. No. 5,109,361.

A traditional flash memory is formed by rows and columns of flash transistors. A wordline decoder provides operational voltages to rows that are coupled to the gates of the transistors, while a bitline decoder provides operational voltages to columns that are coupled to the drains of the transistors. Generally, the sources of the transistors are coupled to a common sourceline and are controlled by a sourceline controller.

In order to perform the required operations of read, program and erase, a plurality of voltage levels must be provided by the wordline decoder. For example, in a traditional read operation the wordline is set to approximately 3 V, in a traditional program operation the wordline is set to approximately 10 V, and in a traditional erase operation the wordline is set to approximately −10 V. This requirement of a large voltage range on the wordline is difficult to provide.

Known wordline decoders have several drawbacks. One of the problems is that either a single wordline (or page) or a block of wordlines (16, 32, 64, 128 pages) is erased or programmed at the same time. There is no flexibility to select an arbitrary number of wordlines within a wordline decoder block or arbitrary number of wordlines among different blocks to be efficiently erased or programmed simultaneously. The reason is that known decoders do not provide a latch function to maintain the program and erase command for each individual wordline. Unlike the wordline decoders, the invention provides a latch for arbitrary selection of the wordlines. In this manner, any number of wordlines either in the same block or different blocks can be selectively erased or programmed at the same time.

A second problem with known wordline decoders is a requirement of the high-voltage level-shifter for the precoder of the wordline decoder. These types of precoders require costly negative and positive high voltage with large silicon real estate that complicate the decoder circuits. For example, Arakawa, U.S. Pat. No. 5,396,459 employs a voltage level shifter at the output of the wordline decoder in order to provide the voltages. An address signal is decoded and a signal is delivered to a level shifter. Then the level shifter transforms the signal to an operational voltage, such as 3, 10 or −10 V. In order to perform the level shift function, the shifter circuit must accommodate a voltage differential of over 10 V.

A third problem with known wordline decoders is that the device's operating voltages are not optimized to allow lower breakdown voltages. The technology traditionally used to manufacture decoder logic cannot tolerate such a large voltage differential of over 10 V. As a result, the level shifter circuit is manufactured using a second technology. This requires additional process steps and reduces the yield of the flash memory.

A fourth problem with known wordline decoders is a lack of efficient economic protection for memory size as small as a wordline or sub-wordline to prevent unintended programming or erasing. Moreover, known wordline decoders do not provide a function for a suspension to read an address in memory while interrupting a programming or erasing operation.

A fifth problem with known wordline decoders is that since large portions (pages) of the memory are erased and programmed in order to change only a small portion of memory, unnecessary erasing and programming operations are performed over a large portion of memory. This reduces the expected life of the memory.

A sixth problem with known wordline decoders is that they do not allow for low voltage erase and program verification voltage such as 1 V or less for operating VDD as low as 1.5 V. Traditionally, the last stage of the wordline decoder is a high-voltage inverter that comprises a pair of long channel p-channel and n-channel devices. A long channel creates a larger threshold voltage for both p-channel and n-channel devices. During the period of erase and program verifications, a verification voltage is coupled to the selected wordline via a p-channel device. In this configuration, the minimum verification voltage must be greater than the p-channel's threshold with a margin. Currently, most flash memories use about 2 V for erase and program verifications. This means that one state of a binary flash cell (the zero state) is set to 2 V which is too high for a 2.7 V (the lowest VDD) read operation. That is why many traditional flash memories boot the wordline during a read operation to achieve high cell current. Additionally, a reason for using high verification voltage for zero-state flash memories is to prevent over-erase conditions with large page erase, sector erase or block erase sizes. Thus, these traditional flash memories will not allow low voltage erase and program verification with a voltage such as 1 V or less for operating VDD as low as 1.5 V.

Goals of the invention are to overcome the identified problems and to provide a new design for a flash memory wordline decoder. In one aspect of the invention, the flash memory can perform a verification with a low verification voltage such as 1 V or less for operating with a VDD supply voltage as low as 1.5 V.

SUMMARY

The invention overcomes the identified problems and provides a flash memory and decoder that can perform a verification with a low verification voltage such as 1 V or less for operating with a VDD supply as low as 1.5 V. An exemplary embodiment of a flash memory wordline decoder includes a plurality of voltage terminals to receive a plurality of voltages, a plurality of address terminals to receive a plurality of address signals, a procedure terminal to receive a procedure signal, and a plurality of output wordlines adapted to be coupled to a bank of flash transistors. The wordline decoder circuit is configured to decode the address signals and includes latches coupled to the wordlines, where the latches are configured to latch the wordlines and to provide an operational voltage on the wordline to accomplish a predetermined operation responsive to the procedure signal.

The exemplary embodiments can be combined with a voltage pump generator. A voltage pump generator provides operational voltages that are derived from the supplied voltages. For example, if the memory is supplied with +3 V, and needs +10 V for an erase function, the voltage pump generator creates the required voltage and provides it to the decoder circuits to accomplish the necessary function. Likewise, the voltage pump can provide a negative voltage to the decoder circuits for the program function.

Advantages of the invention include a verification with a low verification voltage such as 1 V or less for operating with a VDD supply voltage as low as 1.5 V. The decoder also reduces erase/write cycle time and improves expected lifetime of the flash memory due to reduced stress on the flash transistors within the flash memory.

BRIEF DESCRIPTION OF THE FIGURES

Additional advantages of the invention will become apparent upon reading the following detailed description and upon reference to the figures, in which:

FIG. 15 depicts Table 3.

DETAILED DESCRIPTION

Exemplary embodiments are described with reference to specific configurations. Those skilled in the art will appreciate that various changes and modifications can be made while remaining within the scope of the claims. For example, the invention can be used with any type of flash memory using Fowler-Nordheim (F-N) and channel hot electron (CHE) for erase and programming. Note that the traditional decision that an erased state is a low threshold transistor and that a programmed state is a high threshold transistor is arbitrary. In the exemplary embodiments, an erased state is considered to be one where the transistor has a high threshold while a programmed state is considered one where the transistor has a low threshold, however, the invention can also be practiced with the traditional states. All electrical parameters are given by example and can be modified with good results. For example, in the exemplary embodiments, a supply voltage (VDD) is considered as 5 V, but could alternatively be 3 V, 1.5 V or other supply voltage. If a different supply voltage is chosen, the various operational voltage levels would be modified to reflect the different supply voltage.

FLASH MEMORY

Figure 1:
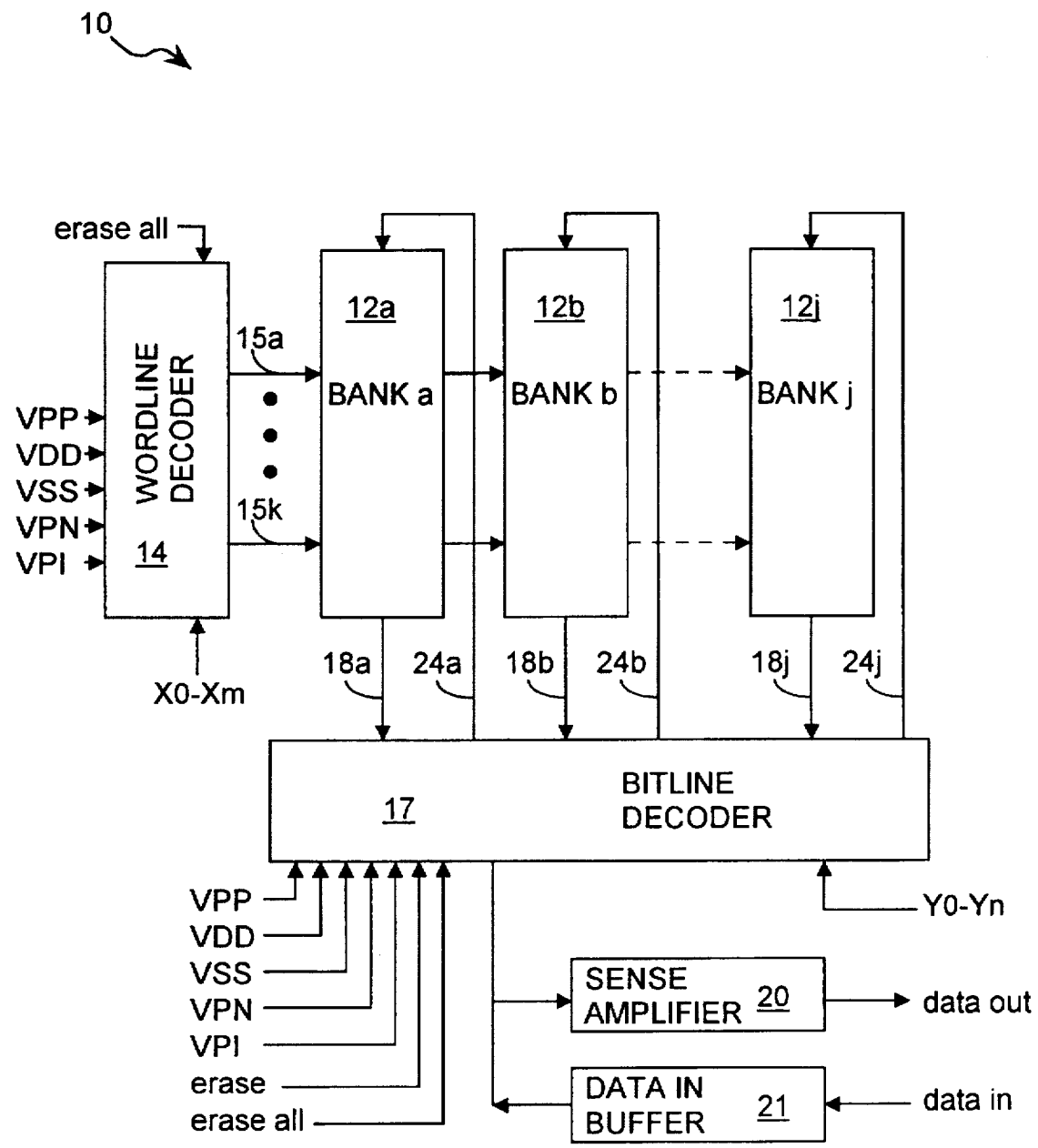
FIG. 1 depicts a multi-bank flash memory incorporating an embodiment of the invention.

FIG. 1 depicts a flash memory 10 incorporating an embodiment of the invention. Flash memory 10 includes a plurality of banks 12a–j that store information. Each bank is constructed similar to a traditional flash transistor array, with rows and columns of flash transistors.

Figure 2:
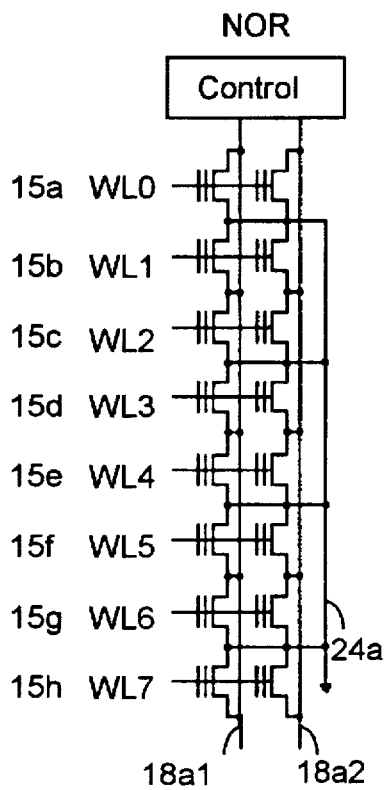
FIG. 2 depicts a well known NOR transistor array for a bank.

FIG. 2 depicts a traditional NOR array construction for banks 12a–j. The transistors in FIG. 2 can be wither n-channel or p-channel devices. For n-channel devices, when the memory is in read mode, sourceline 24a is ground. Control 16' depicts a bitline decoder function that couples a voltage or current source on a selected bitline 18a1, 18a2. If the selected transistor gated by a selected wordline 15a–k has a low threshold and turns on, current flows through the transistor and the bitline is pulled low. If, on the other hand, the transistor has a high threshold, the transistor stays off, no current flows through the transistor and the bitline stays high. Bitline decoder 17 couples the selected bitline to sense amplifier 20 to determine the value of the memory cell. As can be seen, if any of the transistors turns on, the selected bitline is pulled low. Thus, the array shown in FIG. 2 is a NOR array.

Turning back to FIG. 1, a wordline decoder 14 is coupled to each of the banks 12a–j. Wordline decoder 14 receives an address input X0–Xm and decodes the X0–Xm input to activate a wordline 15a–k. Ordinarily, wordlines 15a–k includes a plurality of wordlines (WL0–WLk) where k represents 2 raised to the power m. That is, a design using 4 address lines X0–X3 will provide 16 wordlines WL0–WL15. When wordline decoder 14 is addressed by X0–Xm, a corresponding wordline WL0–WLk is activated.

A bitline decoder 16 is also coupled to each of the banks 12a–j. Bitline decoder 16 receives an address input Y0–Yn and decodes the Y0–Yn input to couple selected bitlines 18a–j from a selected bank to sense amplifier 20. Ordinarily, the a selected bitline (e.g., 18a) includes a plurality of bitlines (BL0–BLq) where q represents a stored word that is usually 8 bits, 16 bits, 32 bits or other number of bits that represents a word to a processor.

In the invention, both wordline decoder 14 and bitline decoder 16 are provided with the operational voltages VPN, VSS, VDD, VPP and VPL In order to read, program and erase the memory, the voltages are selectively applied to selected flash memory cells as described.

WORDLINE DECODER

FIGS. 3A–E depict internal components of wordline decoder 14. In practice, a flash memory will have a large number of cells. In order to identify the selected cells, the address lines X0–Xm and Y0–Yn need to be decoded to identify the selected word. The wordline decoder circuit determines which wordline is selected. Since there are a large number of cells, there will be a large number of address lines to decode. In the present example, address lines X0-X11 are described. This results in $2^{12}$, or 4096, wordlines (WL0-WL4096). However, in order to manage such a large number of wordlines, the decoder circuit is broken down into a plurality of smaller circuits that control a smaller number of wordlines, for example, 16.

Figure 3A:
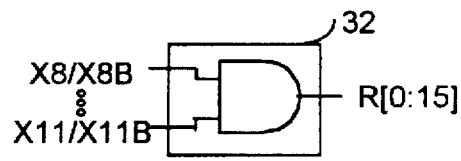
FIGS. 3A–F depict internal components of the decoder circuit of FIG. 1 and exemplary timing diagrams for the components.
Figure 3B:
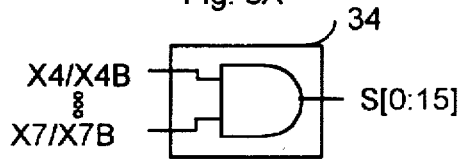
Figure 3C:
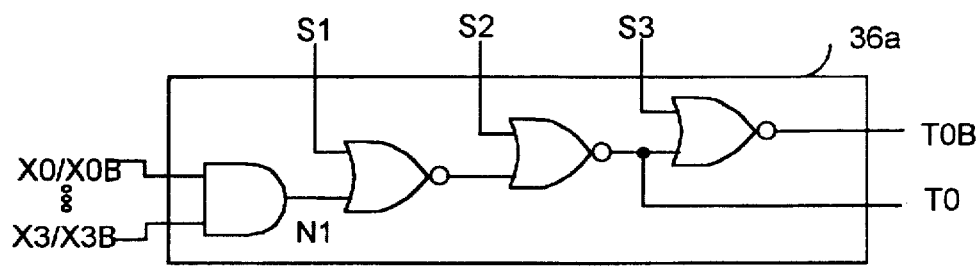
Figure 3D:
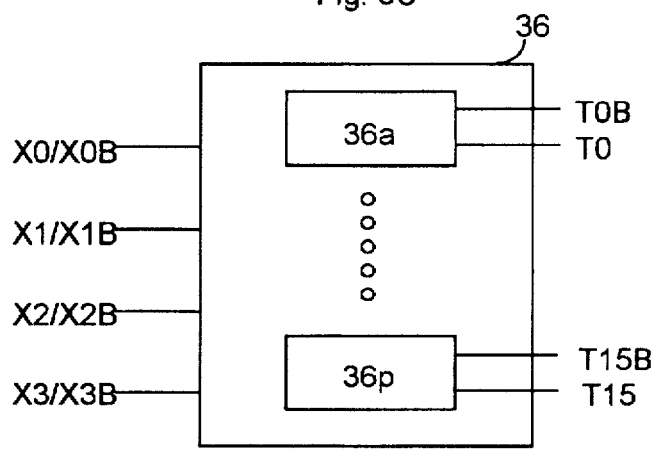

In order to construct such a circuit, three precoders 32, 34 and 36 are used as shown in FIGS. 3A-C. Precoder 32 receives address lines X8-X11 and outputs precoder signals R0-R15, precoder 34 receives address lines X4-X7 and outputs precoder signals S0-S15, and precoder 36 receives address lines X0-X3 and outputs signals T0-T15. Precoder signals R0-R15, S0-S15 and T0-T15 are used to select the internal decoder circuits that will in turn select the wordlines 15a-k. As shown in FIG. 3D, there are 15 T-precoders 36a-p.

Figure 3E:
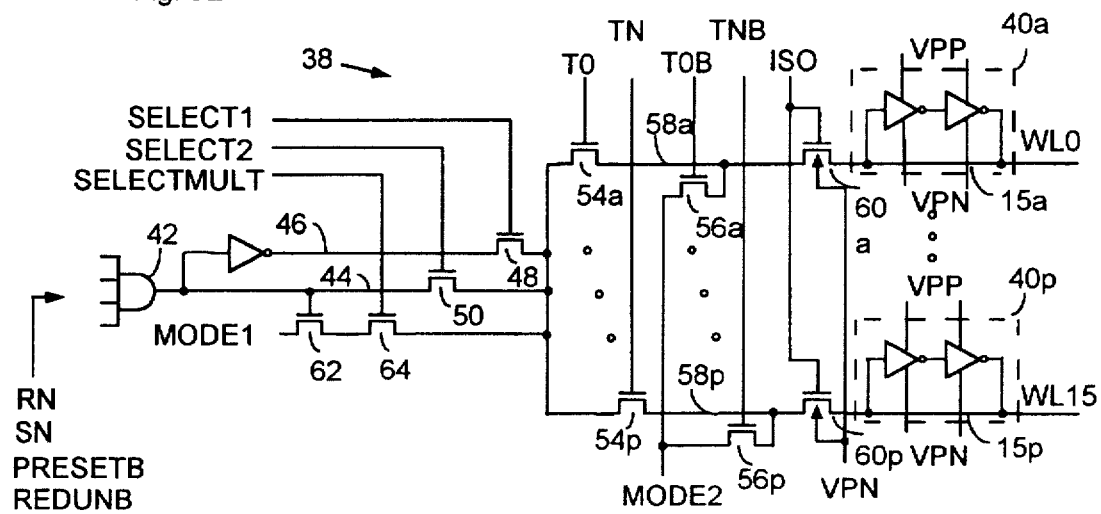

FIG. 3E depicts wordline selector 38. Selector 38 receives various operational signals to select specific wordlines 15a-k. These signals include precoder signals R0-R15, S0-S15 and T0-T15, a SELECT1, SELECT2, SELECTMULT, MODE1, MODE2, and PRESETB. As can be seen, precoder signals R0-R15 and S0-S15 determine whether selector 38 is selected while, if selector 38 is selected, precoder signals T0-T15 determine which wordline WL0-WL15 is selected. An important feature of selector 38 is latches 40a-40p, where there is one latch per wordline. When a program or erase operation is requested on more than one wordline, latches 40a-p can selected multiple wordlines in order to perform the operation efficiently. For example, if two words in a bank need to be programmed, both wordlines can be latched and then wordline decoder 14 can simultaneously provide a program voltage or erase voltage on both lines simultaneously. However, latches 40a-p need to be set and reset depending on whether the program voltage or erase voltage is high or low.

Table 1 demonstrates how select signals S1-S3 are used to control the precoder signals TN and TNB. Using select signals S1-S3 in conjunction with the other signals, MODE1, MODE2, SELECT1, SELECT2, PRESETB, any wordline latch configuration can be achieved. The symbol ! represents a NOT function.

TABLE 1

|  | S1 | S2 | S3 | TN | TNB |
|---|---|---|---|---|---|
| read | L | L | L | X0-X3 | !(X0-X3) |
| init low (MODE2) | L | H | L | L | H |
| init high (PRESETB) | H | L | H | H | L |
| multi | L | L | H | X0-X3 | L |
| isolate | H | H | H | L | L |

The init low is used to insure that all latches 40a-p are set low so that an erase operation can be properly performed. The init low is performed by setting the signals S1, S2 and S3 as shown in Table 1 and setting MODE2 low.

The init high is used to set all the latches 40a-p high so that individual latches can be set low for a program operation. In the init high operation, PRESETB is set low and AND gate 42 forces line 44 low and line 46 high. SELECT1 is set high and SELECT2 is set low so that the transistor 48 is on and 50 is off, which passes the high signal on line 46 via transistor 48 to line 52. Since TN is high and TNB is low, transistors 54a-p pass the signal on lines 52a-p to lines 58a-p. When the ISO signal is high, transistors 60a-p pass the signal on lines 58a-p to wordlines 15a-p. The signal on wordlines 15a-p set latches 40a-p. In this manner all the latches 40a-p are set in response to the PKESETB, SELECT1 and SELECT2 signals.

Figure 3F:
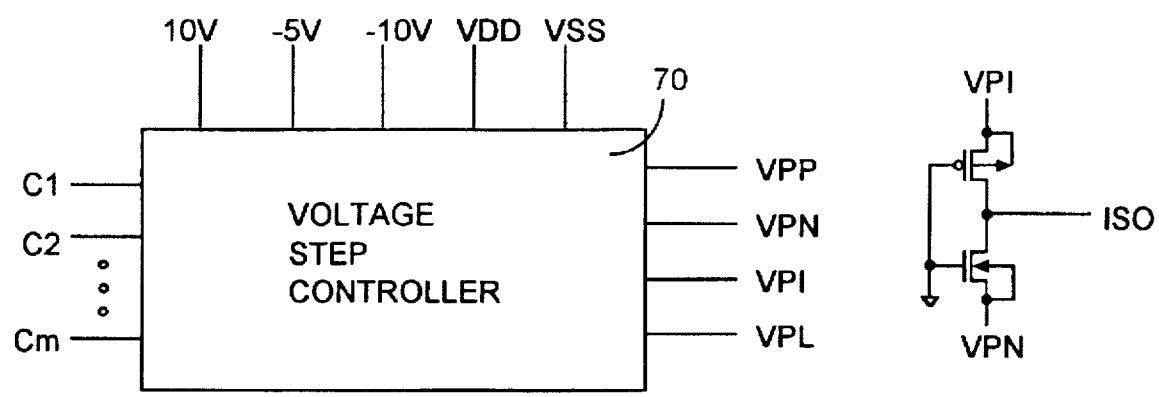

Another important feature of the invention is a voltage step controller 70 as shown in FIG. 3F. Flash memories typically use operational electrical parameters of +10 V to -10 V with respect to ground level. That means the highest voltage of absolute 10 V or less is applied across all decoder devices. If any differential higher than absolute 10 V were applied across some typical transistors used in the wordline decoder, the transistors might be damaged unless their breakdown voltages are increased by a particular technology. The transistor that is built to have a higher breakdown voltage requires a different technology from those typically used. One example to meet a higher breakdown voltage is to make a thicker-grate transistor. However, manufacturing a decoder using multiple technologies complicates the manufacture of the decoder and increases the cost of the flash memory.

An important aspect to the invention is that instead of relying on different technology to overcome the high voltage differential problem, a voltage step controller 70 is employed to insure that no more than a 10 V differential is applied across a decoder transistor at any one time. Controller 70 is supplied with the complete voltage range +10 V to -10 V. The controller also receives control inputs C1-CN which control the value of the voltage outputs such as VPP, VPN, VPI and VPL, to the selector circuit 38. Table 2 demonstrates the voltage progression for the various operations. Note that the read operation does not require any voltage control. As a result, the entire decoder can be manufactured using the same technology transistors, which is very beneficial. For those voltages seen with an arrow (→) comma therebetween, the voltages are shifted among all the outputs stepwise through the operations. That is, the first values go together, the second values (if any) go together, and the third values (if any) go together. The voltages separated by a slash (/) represent the selected/unselected lines. For example, if wordline 0 is selected for an erase verify, which appears as 6/0, the voltage on WL0 is 6 V and the voltage on the other wordlines is 0 V. Table 3 depicts a summary of voltages for the various operations.

Figure 4A:
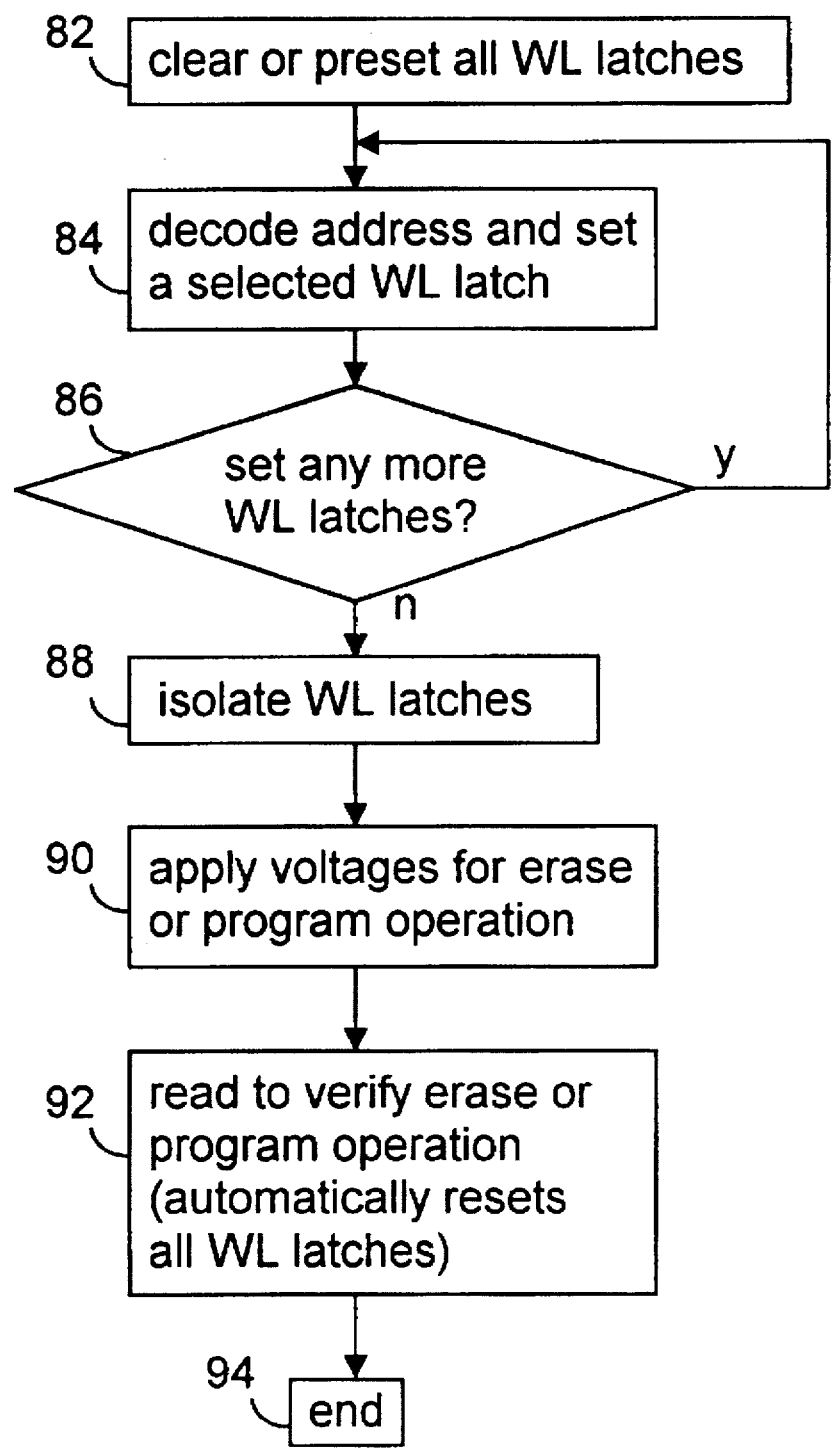
FIGS. 4A–C show operation of the decoder circuit of FIGS. 3A–F.

FIG. 4A is a flowchart showing operation of the decoder circuit of FIG. 1. In operation, step 82 clears or presets all wordline latches 40a-p. Then, step 84 decodes the address input X0-Xm to determine the selected wordline and sets the selected latch 40a-q. If there are additional latches to set, step 86 returns to step 84 to decode another address to set another latch. If no other latches are to be set, step 86 moves to step 88 where the latches are isolated from the TN transistors 54a-p and 56a-p by lowering the ISO signal to turn off transistors 60a-p. Step 90 applies the operational voltages to the latches 40a-p in order to drive the selected wordlines to the required voltages. If, for example a program is required, the selected wordline is driven to -10 V. Step 92 reads the flash memory to verify that the erase or program operation was completed successfully, and then completes the procedure in step 94.

Figure 4B:
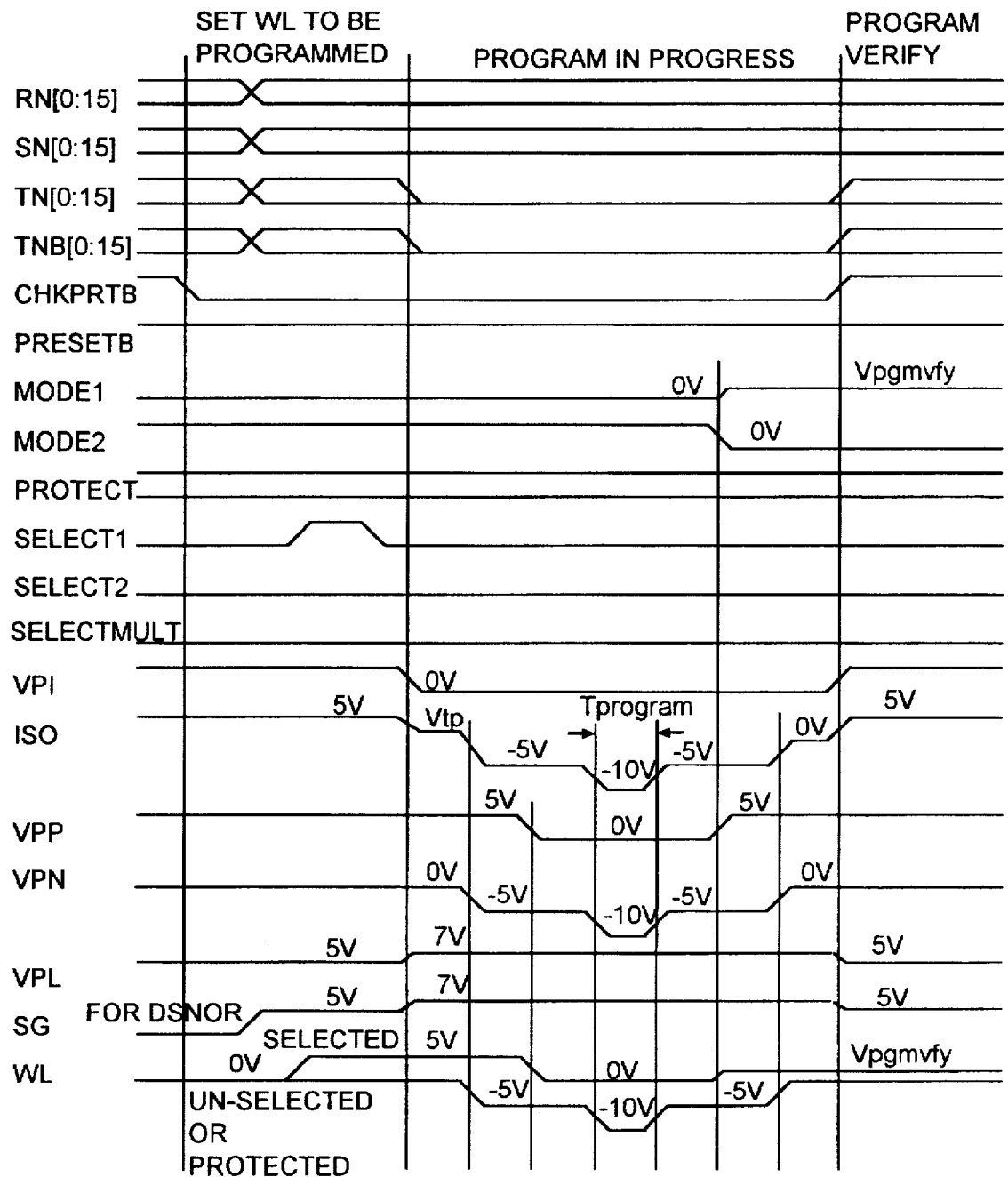
Figure 4C:
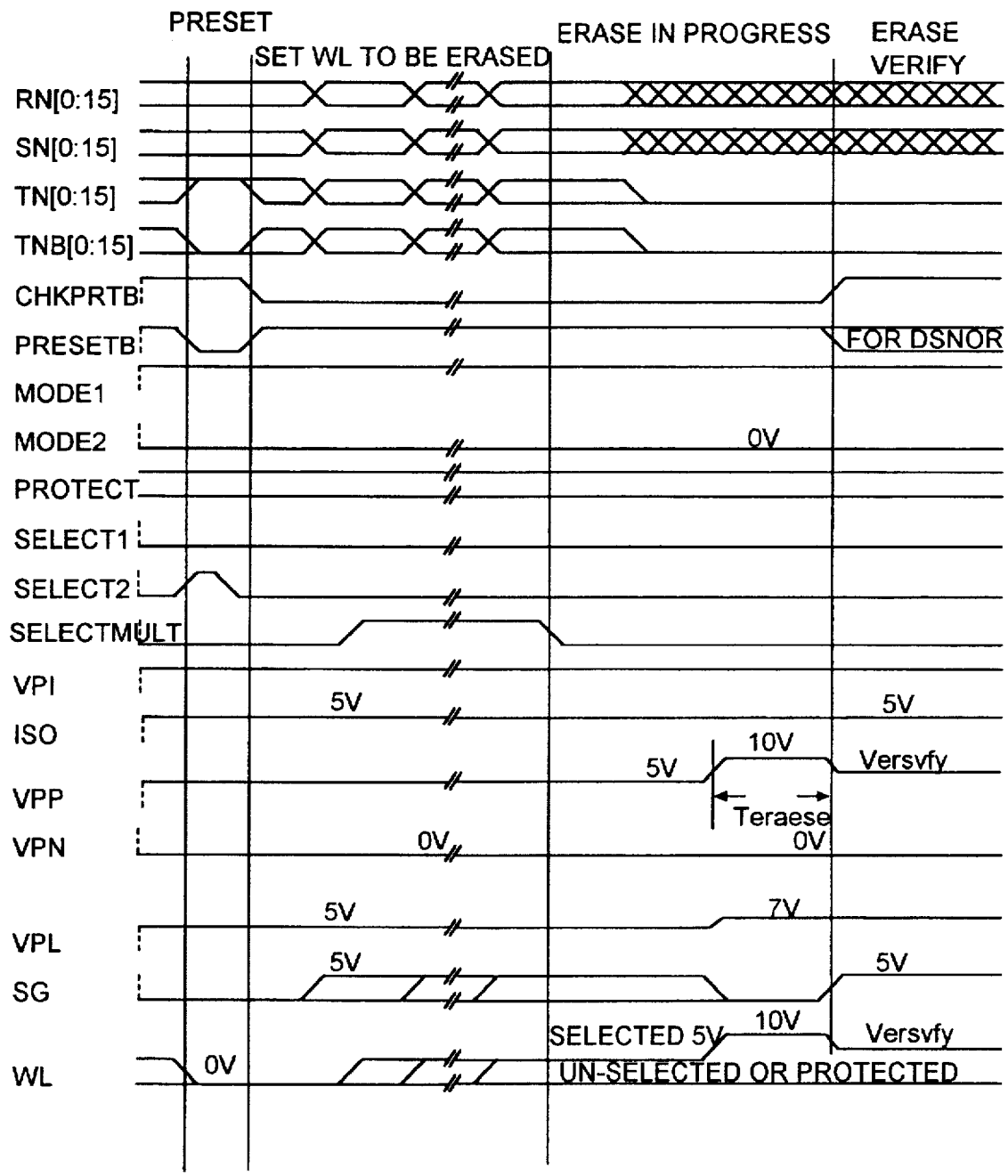

Referring to FIGS. 4B-C, timing diagrams are shown that depict the operation of the decoder circuit. These timing diagrams are to be taken in conjunction with the voltages depicted in Table 2, with particular attention to the controlled voltage levels of VPP, VPL, SG and WL, shown is the control of the voltages so that the voltages supplied to the various transistors does not exceed a differential greater than 10 V.

Figure 5:
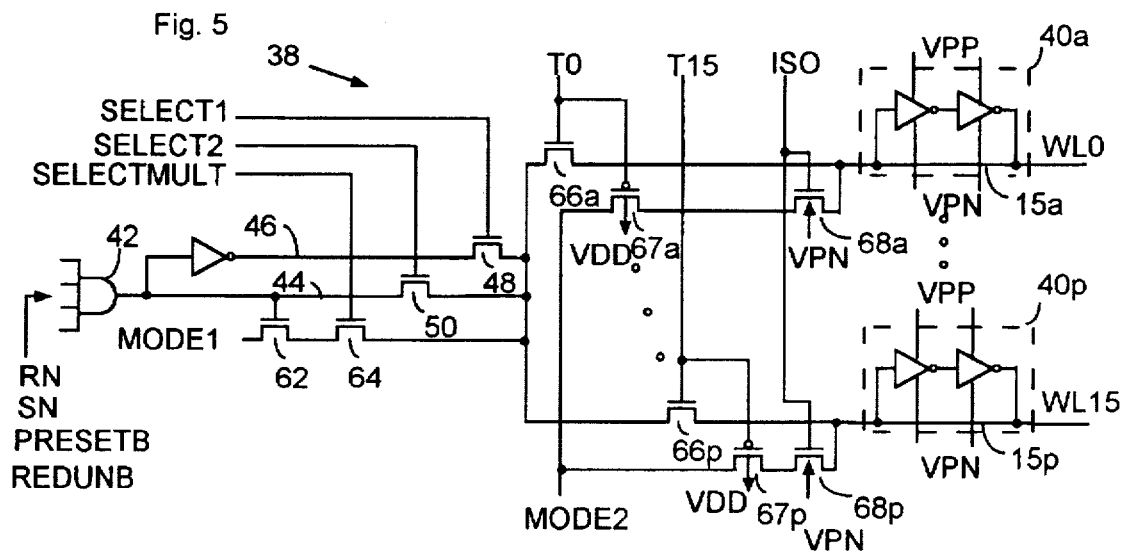
FIG. 5 depicts an alternate internal component of the decoder circuit of FIG. 1.

FIG. 5 depicts an alternate internal component of the decoder circuit of FIG. 1. Instead of using two pass-gate n-channel devices gated by T0–T15 and T0B–T15B, as shown in FIG. 3E, a pair of n-channel 66a–p and p-channel 67a–p pass-gate devices is used. In this implementation, only signals T0–T15 are required, and the 16 lines of signals T0B–T15B are saved. Note that an isolation device 68a–p is positioned between each wordline and an n-channel pull-down device 67a–p is gated by T0–T15 for isolation during erasing and programming. Other protection and suspension functions can be added and are supported as described below with reference to FIGS. 6–12. Table 4 shows the operational voltages supplied by the voltage step controller 70 so that the voltages supplied to the various transistors does not exceed a differential greater than 10 V. The operation is similar to the timing diagrams of FIGS. 4B–C and the voltages of Table 3.

LOW VOLTAGE OPERATION

An important advantage of the invention is that the flash memory can perform a verification with a low verification voltage such as 1 V or less for operating with a VDD supply voltage as low as 1.5 V.

Known wordline decoders are driven by an inverter rather than the direct signal from a wordline decoder. These decoders operate satisfactorily during regular read operations using an operating voltage in excess of the transistor threshold (e.g. 3 V). However, the decoders will not operate satisfactorily using a low operating voltage such as 1.5 V.

Referring to FIG. 3E latch 40a, note that the inverter receives voltages VPP and VPN. For 5 V operation, one of the flash cell's Vt (voltage threshold) is controlled below 2 V. During a read operation, a channel voltage differential of 3 V (Vgs=Vgate–Vt) is obtained when a 5 V gate voltage is applied to the selected wordline. For 3 V operation, a much reduced channel voltage differential of 1 V (Vgs=Vgate–Vt) is obtained when a 3 V gate voltage is applied to the selected wordline. Therefore, the low Vt has to be lowered below 2 V and is better to be 1 V or 0.7 V for 3 V or 1.5 V operation. Furthermore, as the cell's Vt drops below 1 V, it is desired to be detected and increased by the techniques of Vt refreshment. In this case, a wordline voltage of less than 1 V is necessary to detect a degraded cell. Since known decoders drive the wordline by an inverter, a minimum wordline voltage less than Vtp (p-channel threshold) which is around 1 V can not be provided. However, the inventive decoder shown in FIG. 3E drives the wordline from MODE1 rather than from a p-channel device. Therefore, any wordline voltage less than VDD can be coupled directly from MODE1 to the selected wordline. Moreover, any wordline voltage higher than Vtp and VDD can be coupled directly from VPP as in known decoders. The result is that the inventive wordline decoder is very suitable for operation with low voltage power supply levels such as 1.5 V.

PROTECT FEATURE

Figure 6:
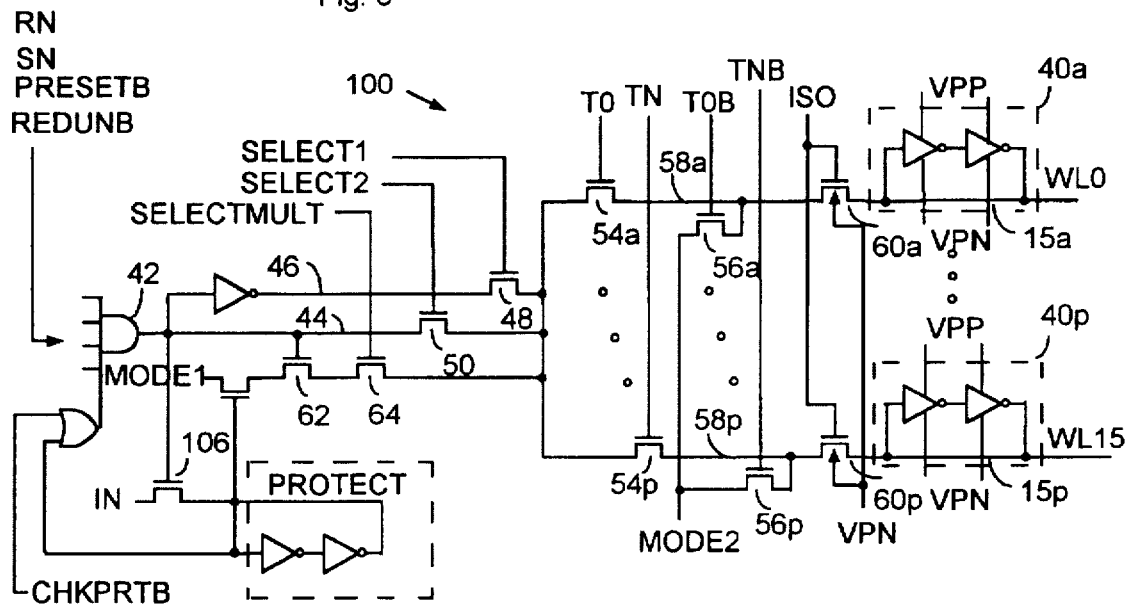
FIG. 6 depicts an internal component of the decoder circuit of FIG. 1 with a protect option.

FIG. 6 depicts an internal component of the decoder circuit of FIG. 1 with a protect option. If there is a need to prevent a portion of the memory from a destructive procedure such as programming or erasing, a protect bit can be stored and associated with a memory location. When the memory is requested to be programmed or erased, the decoder checks the protect bit before that procedure is performed.

Figure 7A:
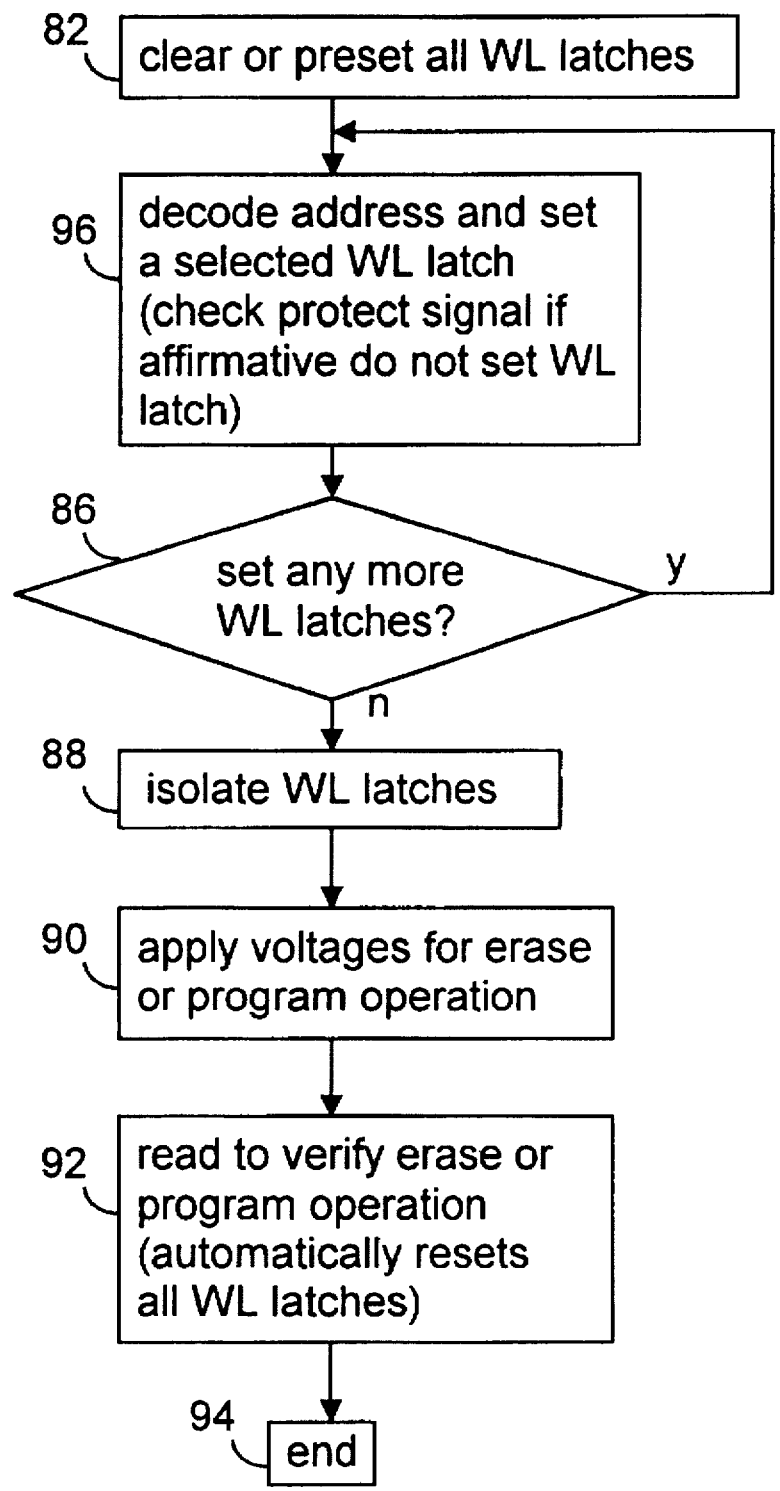
FIGS. 7A–B show operation of the decoder circuit of FIG. 6 with a protect option.

FIG. 7A is a flowchart showing operation of the decoder circuit of FIG. 1 with a protect option. The flowchart is similar to that in FIG. 4 except that step 96 is substituted for step 84. Step 96 decodes the input address and checks to insure that the protect signal is not affirmative. If the protect signal is affirmative, step 96 will prevent the latch 40a–p from being set. An override can be configured on the memory for steps such as an initial program or for erase of confidential information.

Figure 7B:
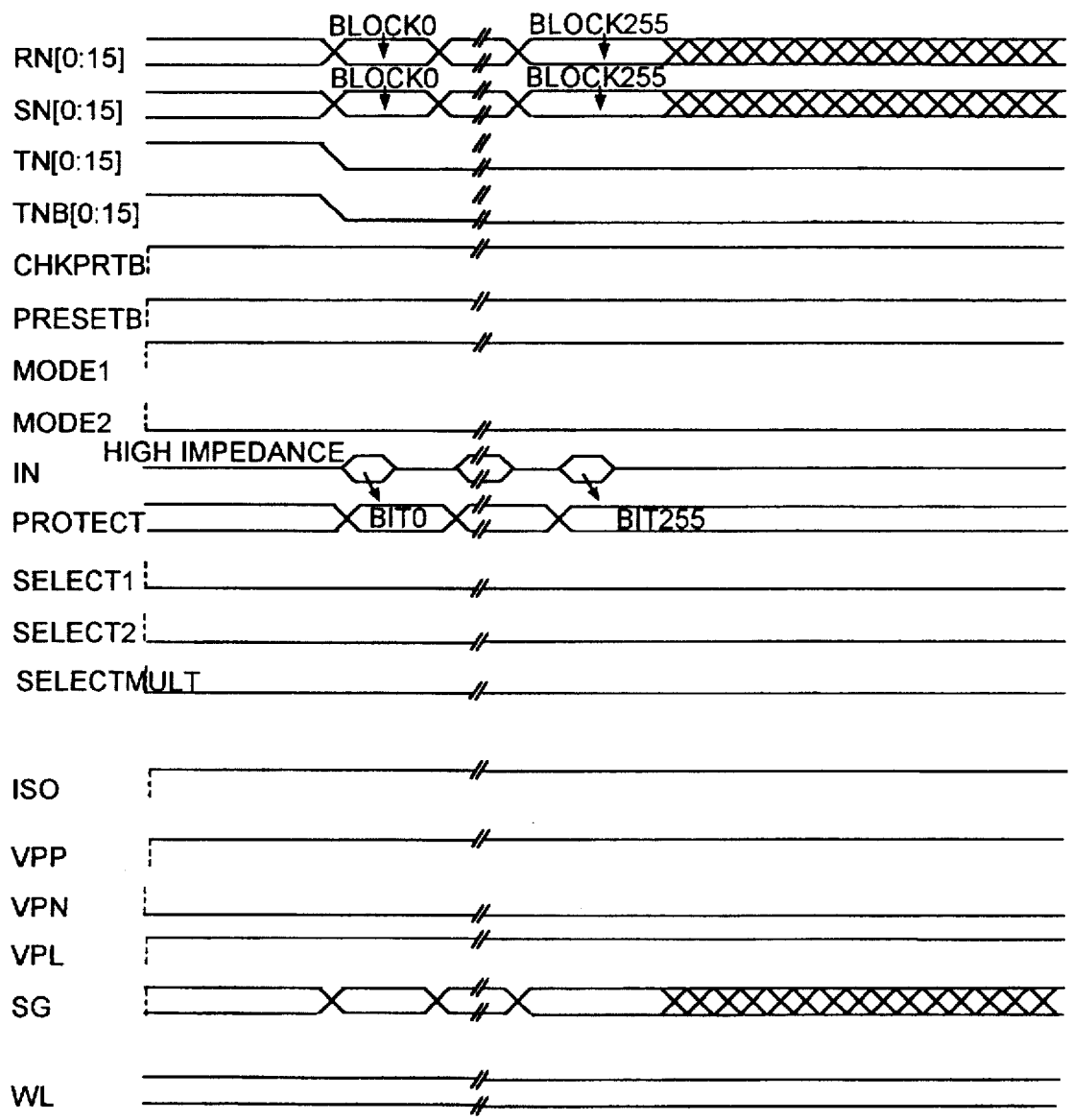

Referring to FIG. 7B, a timing diagram is shown that depict the operation of the decoder circuit with the protect feature. These timing diagrams are to be taken in conjunction with the voltages depicted in Table 5 for the protect feature. The timing diagrams of FIGS. 4B–C are equally applicable to this circuit. With particular attention to the controlled voltage levels of VPP, VPL, SG and WL, shown is the control of the voltages so that the voltages supplied to the various transistors does not exceed a differential of greater than 10 V.

DUAL STRING MEMORY ARCHITECTURE

Figure 8:
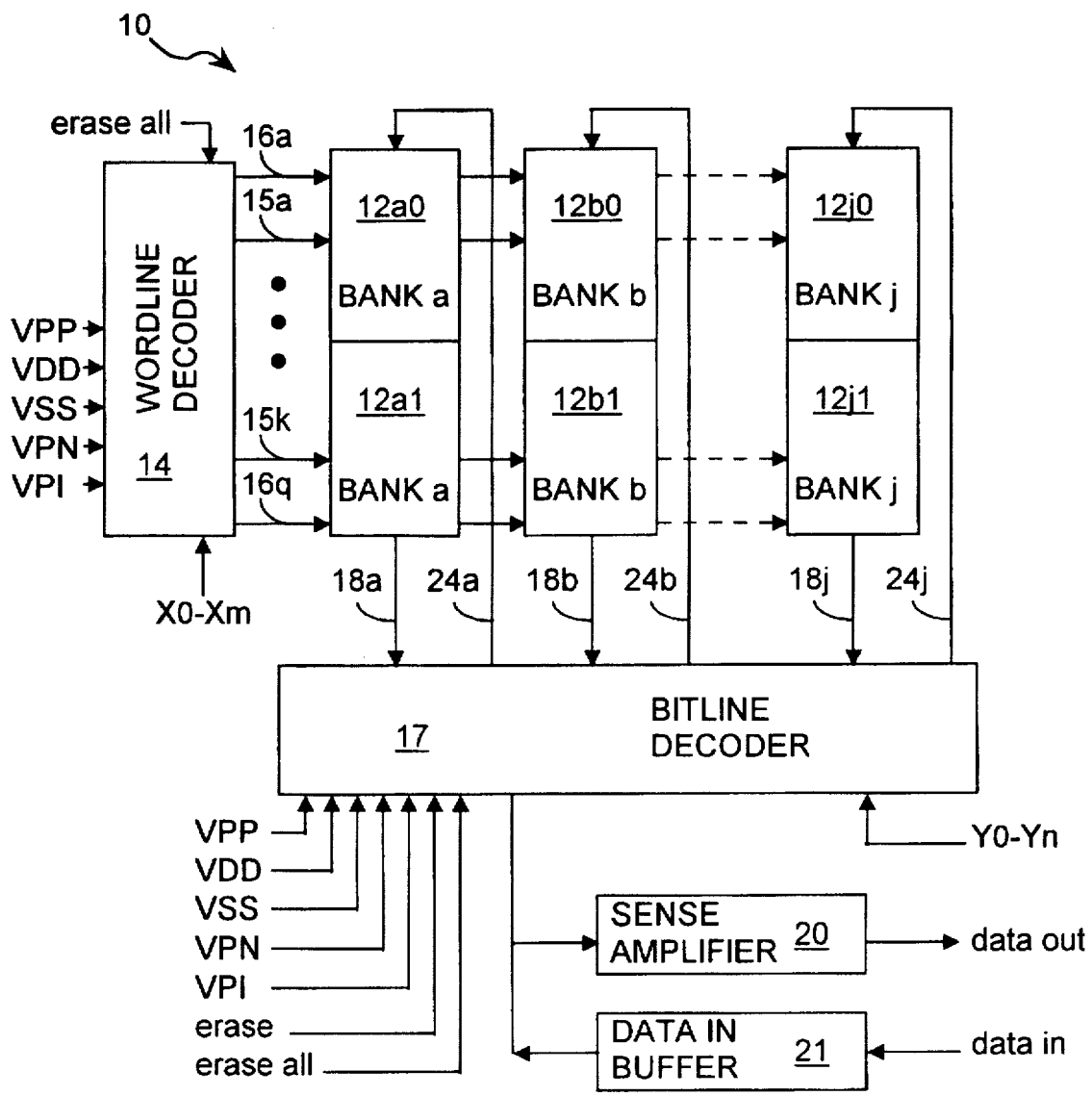
FIG. 8 depicts a multi-bank flash memory incorporating another embodiment of the invention.

FIG. 8 depicts a multi-bank flash memory incorporating another embodiment of the invention. This embodiment is configured to provide a suspend feature in the memory. The rationale behind the suspend feature is that a program or erase procedure takes a significant amount of time on the order of 10 ms, while the read procedure takes only 100 ns. If an erase or program procedure is being performed on one portion of memory and a read is requested for another portion of memory, it would be helpful to suspend the program or erase procedure and provide the data for the read request. The dual string memory architecture and decoder provide just such feature. The decoder can have certain latches set to enable a program or erase feature and can maintain those latch values while a different portion of memory is read. When the read procedure is complete, the memory resumes the program or erase procedure since the latches for the program or erase procedure are still set.

Figure 9A:
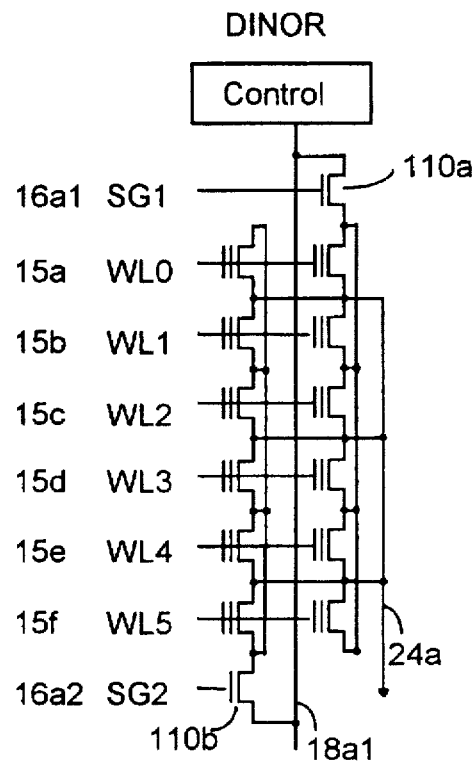
FIGS. 9A–C depict well known DINOR, dual string NOR and AND transistor arrays for a bank.
Figure 9B:
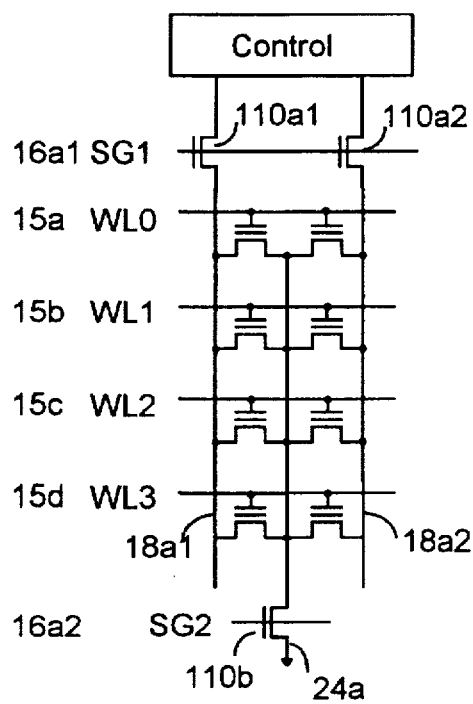
Figure 9C:
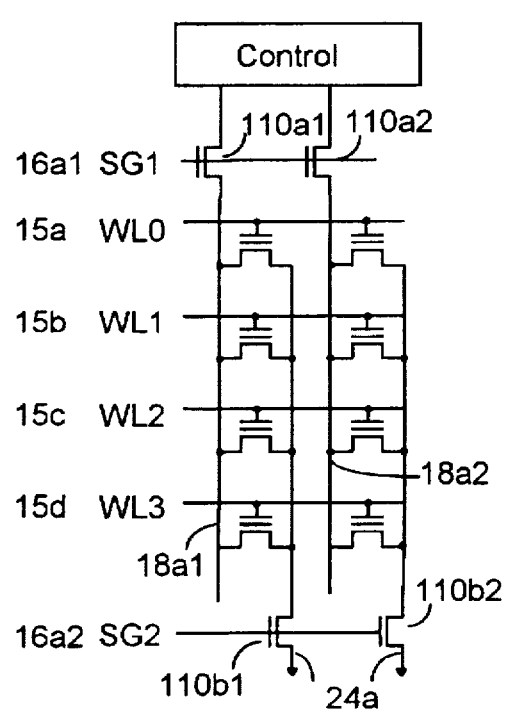

In this embodiment, banks 12a–j include additional transistors called control transistors. FIGS. 9A–C show the dual string architecture in greater detail including control transistors 110. Wordline decoder 14 includes additional control lines 16a–b to control transistors 110. Control line 16a controls transistors 110a and control line 16b controls transistors 110b.

FIGS. 9A–C depict well known DINOR, dual string NOR and AND transistor arrays for a bank. The transistors in FIGS. 9A–C can be either n-channel or p-channel devices. FIG. 9A depicts a DINOR array where either the left or right NOR string is selected via control transistors 110a and 110b. FIG. 9B depicts a dual string NOR array where control transistors 110a1 and 110a2 select the left or right NOR string and control transistor 110b controls the sourceline for the array. FIG. 9C depicts a dual string AND array where control transistors 110a1 and 110b1 select the left side and control transistors 110a2 and 110b2 select the right side. In any event, the important feature is that the transistor banks can be isolated from one another so that a transistor value in one bank when the wordline is selected, will not affect the bitline of another bank.

Figure 10:
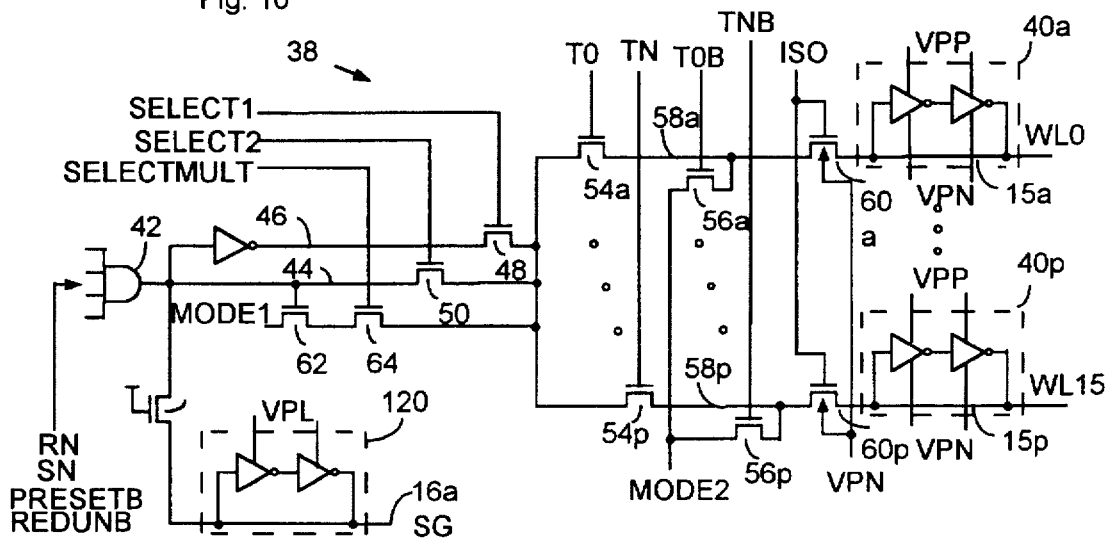
FIG. 10 depicts an internal component of the decoder circuit of FIG. 8.
Figure 11:
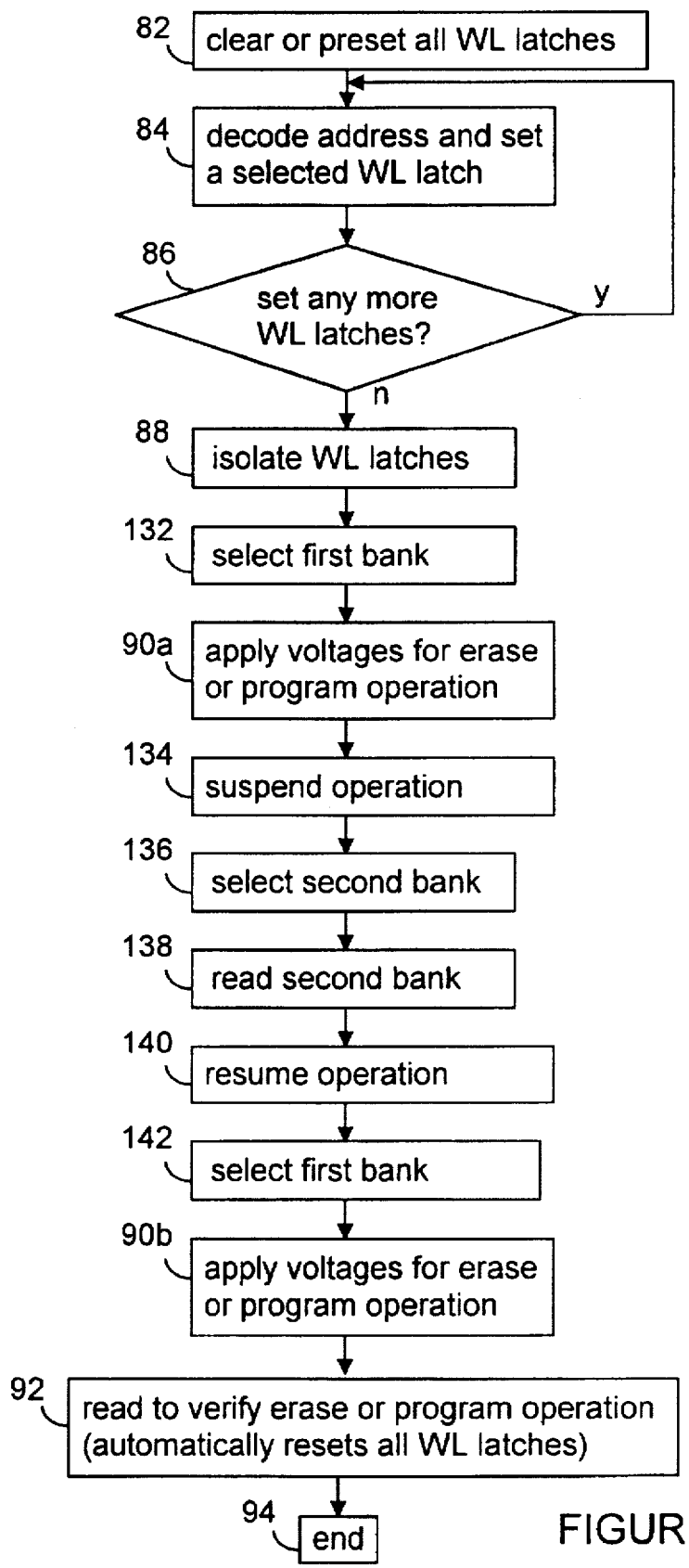
FIG. 11 is a flowchart showing operation of the decoder circuit of FIG. 8.

FIG. 10 depicts an internal component of the decoder circuit of FIG. 8. Note the addition of control circuit 120 which provides control line 16a. Control circuit 120 can be expanded to provide all the control lines 16a–n for the memory. FIG. 11 is a flowchart showing operation of the decoder circuit of FIG. 8. The operation is similar to that of the FIG. 4 flowchart. Following step 88, a step is performed to select the first bank which is to be programmed or erased.

This step involves activating control lines 16a–n to enable a selected first bank. Step 90a involves applying the program or erase voltage on the selected wordlines. However, step 90 is interrupted by a read request and step 134 suspends the program or erase operation for a read operation. Step 136 selects a second bank where the read procedure is to take place. Step 138 performs the read procedure and provides the memory data to the sense amplifier. Once the read is complete, step 140 resumes operation of the program or erase procedure. Step 142 re-selects the first bank and step 90b continues to apply the operational voltages to the selected wordlines to perform the requested procedure. Step 92 verifies the program or erase operation and step 94 completes the procedure.

PROTECT FEATURE

Figure 12:
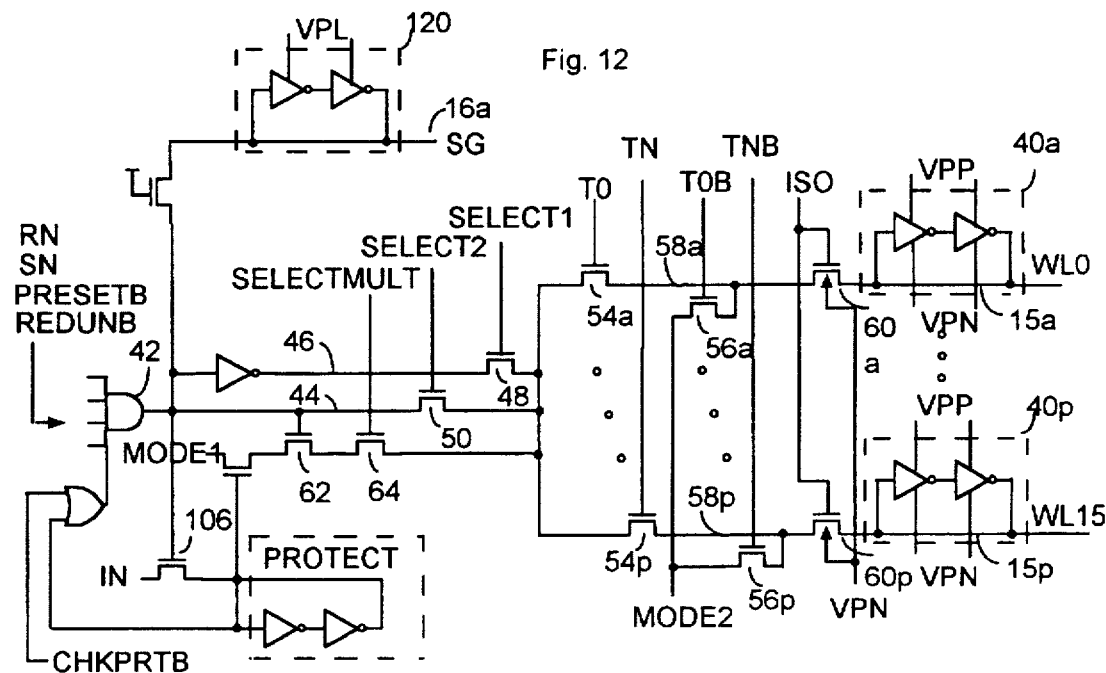
FIG. 12 depicts an internal component of the decoder circuit of FIG. 8 with a protect option.

FIG. 12 depicts an internal component of the decoder circuit of FIG. 8 with a protect option. If there is a need to prevent a portion of the memory from a destructive procedure such as being programmed or erased, a protect bit can be stored with the dam. When the memory is requested to be programmed or erased, the memory checks the protect bit before that procedure is performed. In operation, the decoder 12 would operate similar to the flowchart of FIG. 7A.

SPLIT DECODER ARCHITECTURE

Figure 13:
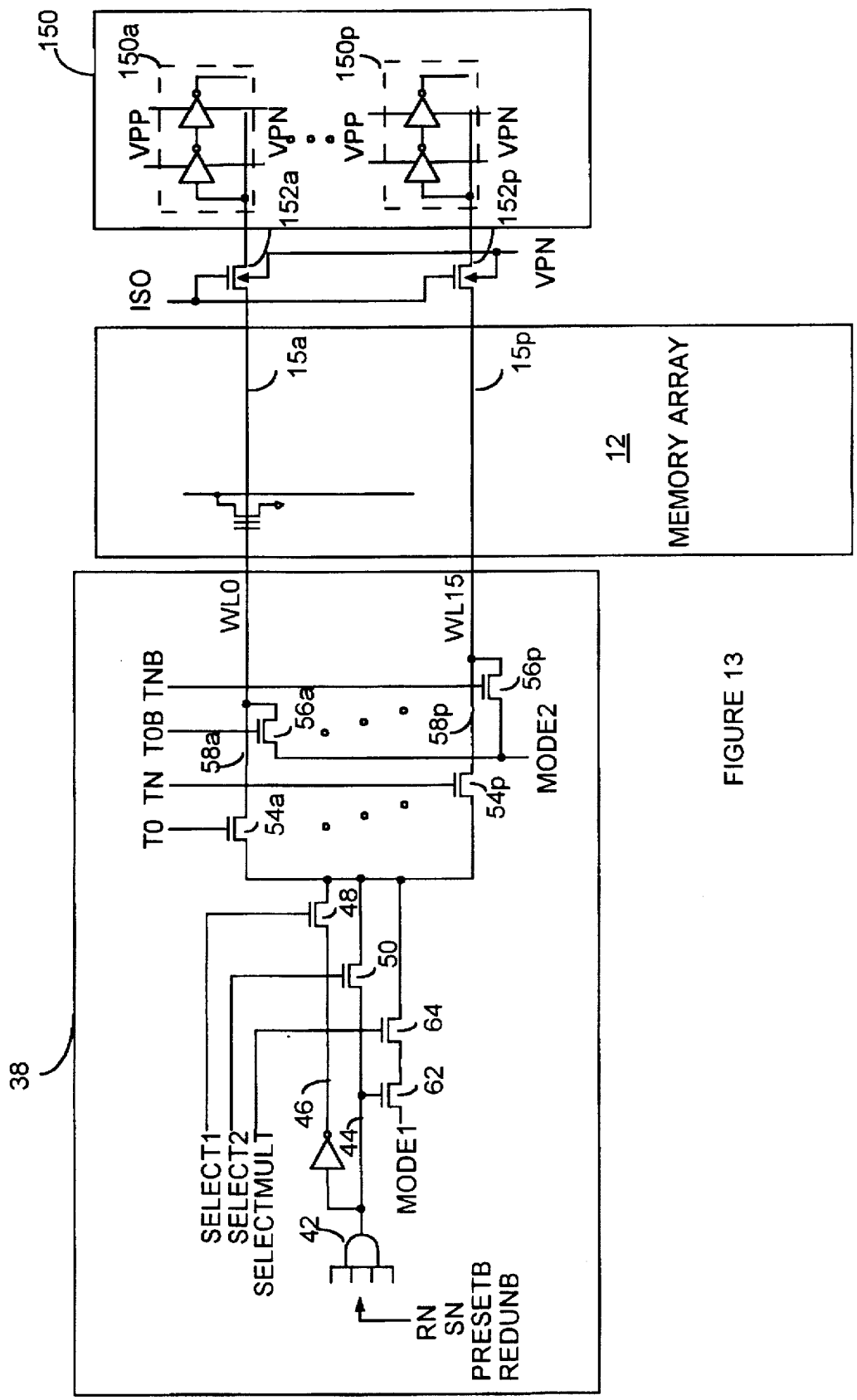
FIG. 13 depicts a split decoder architecture according to an embodiment of the invention.

Additional embodiments are described with reference to FIGS. 13 and 14. In the FIG. 13 embodiment, a selector circuit 38, similar to that of FIG. 3E, is coupled to a flash memory array 12 via wordlines 15a–p. Coupled to the wordlines 15a–p, and located at the opposite end of memory array 12, are latches 150a–p and isolation devices 152a–p. Isolation devices 152a–p are controlled by an ISO2 signal.

An advantage to this architecture is that latches 150a–p provide the operational voltages for the erase, program and read operations. Additionally, latches 150a–p can sustain their latched state when isolation devices 152a–p are turned off by the ISO2 signal. This feature is beneficial because the latches can be isolated after a program or erase operation for verification, and the data does not need to be reloaded after the verification. Additionally, this embodiment is useful in a suspend operation because it provides that the same bank of memory that was being programmed or erased can now be read, and when the read operation is complete, the program or erase can continue.

Figure 14:
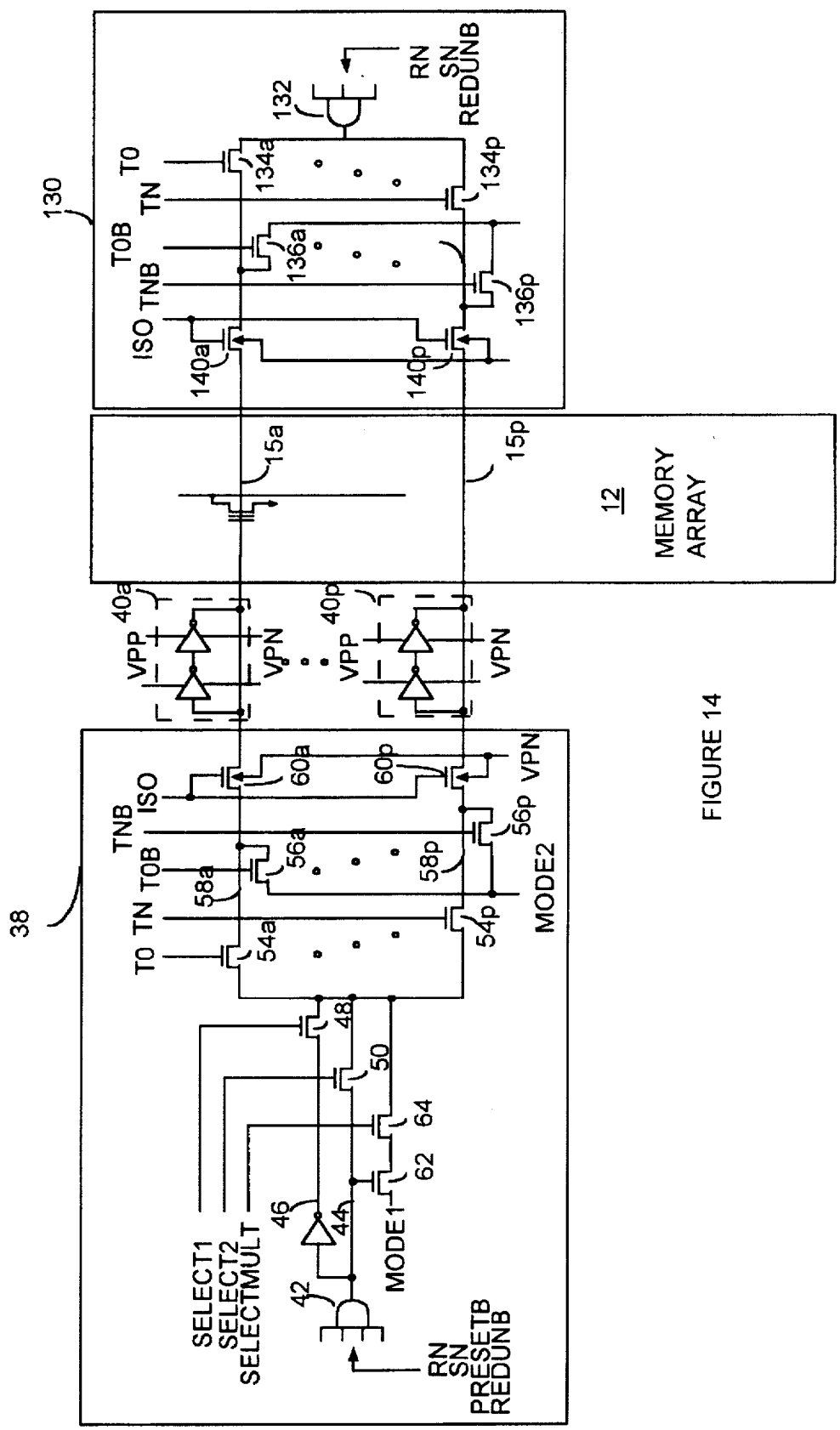
FIG. 14 depicts a split decoder architecture according to another embodiment of the invention.

In the FIG. 14 embodiment, a selector circuit 38, similar to that of FIG. 3E, is coupled to a flash memory array 12 via wordlines 15a–p with latches 40a–p. Coupled to the wordlines 15a–p, and located at the opposite end of memory array 12, is a second selector circuit 130. Selector circuit 130 receives several of the same control signals as selector circuit 38 such as RN, SN, TN, TNB. However, isolation devices 140a–p are controlled by an ISO2 signal. This creates a split decoder that supplies operational voltages to both ends of wordlines 15a–p simultaneously. This architecture is particularly useful in high speed operation when a wordline must be activated quickly.

For both of the split decoder embodiments, protection and suspension functions can be added and are supported as described below with reference to FIGS. 6–12.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3 V), and needs VPP(+10 V) for a program function, the voltage pump generator creates the needed voltage and provides it to the decoder circuits to accomplish the necessary function. Likewise, the voltage pump can provide a negative voltage VPN(–10 V) to the decoder circuits for the erase function.

CONCLUSION

The invention provides many advantages over known techniques. The invention reduces program time. In a typical flash memory, the entire array is erased and re-programmed, which is a time-consuming procedure. Even when a page-erase feature is provided, the entire page is erased and re-programmed, which is also time-consuming. The invention provides a fast and convenient way to erase only those bytes that need to be re-programmed. The invention reduces time and provides improves processor access to the flash memory. Additionally, the invention reduces power consumption by using power only when a byte-erase and re-program are required. This is an important advantage for portable electronics.

The invention also improves the longevity of the flash memory. Since only the bytes that require re-programming are erased, stress on the flash memory cells is reduced. In the exemplary embodiments, the minimum erase size is one byte without sacrificing the array size. The invention provides that unnecessary program/erase cycles are not performed on the deselected cells. As a result, the invention can provide a large number of operable program/erase cycles, such as 10≠program/erase cycles, in a flash memory. Finally, flash memories incorporating the invention can be constructed using any size array such as a 16×32, 1K×1K, 1K×2K, or N×M array.

Having disclosed exemplary embodiments and the best mode, modifications and variations may be made to the disclosed embodiments while remaining within the scope of the invention as defined by the following claims.

What is claimed is:

1. A flash memory wordline decoder comprising:

a plurality of voltage terminals to receive a plurality of voltages;

a plurality of address terminals to receive a plurality of address signals;

a procedure terminal to receive a procedure signal;

a plurality of output wordlines adapted to be coupled to a bank of flash transistors; and a decoder circuit coupled to said voltage terminals, said address terminals and said procedure terminal and configured to decode said address signals, said decoder circuit including a latch circuit coupled to said wordlines and configured to selectively latch a random set of wordlines and to simultaneously provide an operational voltage on said set of wordlines to accomplish a predetermined operation responsive to said procedure signal.

2. The flash memory wordline decoder of claim 1, wherein:

said decoder circuit further includes a plurality of latches each coupled to one of said wordlines and configured to selectively latch said set of wordlines and to simultaneously provide an operational voltage on said set of wordlines to accomplish a predetermined operation responsive to said procedure signal.

3. The flash memory wordline decoder of claim 2, wherein:

said wordline latches are configured to reset in response to a read signal.

4. The flash memory wordline decoder of claim 3, wherein:

said plurality of latches are positioned at an opposite end of said wordlines.

5. The flash memory wordline decoder of claim 2, further comprising:

a voltage step controller coupled to said latches and configured to supply said latches with operational voltages such that the maximum voltage differential applied to a single transistor is 10 V.

6. The flash memory wordline decoder of claim 2, wherein:

said plurality of latches are positioned at an opposite end of said wordlines.

7. The flash memory wordline decoder of claim 2, further comprising:

a second decoder circuit coupled to said voltage terminals, said address terminals, said procedure terminal and an opposite end of said wordlines and configured to decode said address signals, and configured to provide an operational voltage on said wordline to accomplish a predetermined operation responsive to said procedure signal.

8. The flash memory wordline decoder of claim 1, further comprising:

a protect terminal to receive a protect signal; and wherein said decoder circuit is configured to check said protect signal to determine whether a selected wordline is protected, and when said protect signal is affirmative, to prevent a latch coupled to said selected .wordline from being set.

9. The flash memory wordline decoder of claim 8, further comprising:

an override terminal to receive an override signal; and wherein said decoder circuit is coupled to said override terminal and configured to ignore said protect signal in response to said override signal.

10. The flash memory wordline decoder of claim 9, wherein:

said latch is positioned at an opposite end of said wordline.

11. The flash memory wordline decoder of claim 8, further comprising:

a voltage step controller coupled to said latches and configured to supply said latches with operational voltages such that the maximum voltage differential applied to a single transistor is 10 V.

12. The flash memory wordline decoder of claim 8, wherein:

said latch is positioned at an opposite end of said wordline.

13. The flash memory wordline decoder of claim 1, further comprising:

a voltage step controller coupled to said latches and configured to supply said latches with operational voltages such that the maximum voltage differential applied to a single transistor is 10 V.

14. The flash memory wordline decoder of claim 13, wherein:

said latch is positioned at an opposite end of said wordline.

15. The flash memory wordline decoder of claim 1, further comprising:

a suspend terminal to receive a suspend signal;

a first output control line adapted to be coupled to a first bank of flash transistors and a second output control line adapted to be coupled to a second bank of flash transistors; and wherein said decoder circuit is coupled to said suspend terminal and configured to suspend an operation responsive to said suspend signal.

16. The flash memory wordline decoder of claim 15, wherein:

said decoder circuit is configured to activate said first output control line responsive to an operation and configured to deactivate said first output control line responsive to said suspend signal; and said decoder circuit is configured to activate said second output control line responsive to said suspend signal.

17. The flash memory wordline decoder of claim 15, wherein:

said decoder circuit is configured to activate said first output control line responsive to one of a program operation and erase operation and configured to deactivate said first output control line responsive to said suspend signal; and said decoder circuit is configured to activate said second output control line responsive to said suspend signal to perform a read operation.

18. The flash memory wordline decoder of claim 15, wherein:

said decoder circuit is configured to activate said first output control line responsive to one of a program operation and erase operation on said first bank of flash transistors and configured to deactivate said first output control line responsive to said suspend signal; and said decoder circuit is configured to activate said second output control line responsive to said suspend signal to perform a read operation on said second bank of flash transistors.

19. The flash memory wordline decoder of claim 15, wherein:

said latch is positioned at an opposite end of said wordline.

20. The flash memory wordline decoder of claim 1, wherein:

said latch is positioned at an opposite end of said wordlines.

21. The flash memory wordline decoder of claim 1, further comprising:

a second decoder circuit coupled to said voltage terminals, said address terminals, said procedure terminal and an opposite end of said wordlines and configured to decode said address signals, and configured to provide an operational voltage on said wordline to accomplish a predetermined operation responsive to said procedure signal.

22. A method of manufacturing a flash memory wordline decoder comprising the steps of:

forming a plurality of voltage terminals to receive a plurality of voltages;

forming a plurality of address terminals to receive a plurality of address signals;

forming a procedure terminal to receive a procedure signal;

forming a plurality of output wordlines adapted to be coupled to a bank of flash transistors; and forming a decoder circuit couple to said voltage terminals, said address terminals and said procedure terminal and configured to decode said address signals, said decoder circuit including a latch circuit coupled to said wordlines and configured to selectively latch a random set of wordlines and to simultaneously provide an operational voltage on said set of wordlines to accomplish a predetermined operation responsive to said procedure signal.

23. The method of claim 22, wherein:

said forming a decoder step includes the step of forming a plurality of latches each coupled to one of said wordlines and configured to selectively latch said set of wordlines and to simultaneously provide an operational voltage on said set of wordlines to accomplish a predetermined operation responsive to said procedure signal.

24. The method of claim 23, further comprising the steps of:

receiving a protect signal; and checking said protect signal to determine whether a selected wordline is protected, and when said protect signal is affirmative, preventing said latching steps.

25. The method of claim 24, further comprising the steps of:

receiving an override signal; and ignoring said protect signal when said override signal is affirmative.

26. The method of claim 24, further comprising the step of:

controlling voltage to said latches to supply said latches with operational voltages such that the maximum voltage differential applied to a single transistor is 10 V.

27. The method of claim 22, wherein:

said forming a decoder step includes the step of forming said latch on an opposite end of said wordline.

28. The method of claim 22, wherein:

said forming a decoder step includes the step of forming a plurality of latches on an opposite end of said wordlines, each latch coupled to one of said wordlines and configured to latch said wordlines and to provide an operational voltage on said wordlines to accomplish a predetermined operation responsive to said procedure signal.

29. A method of retrieving information from a flash memory having a plurality of wordlines and a wordline latch circuit coupled to said wordlines, said method comprising the steps of:

receiving a plurality of voltages;

receiving a plurality of address signals;

receiving a procedure signal;

decoding said address signals;

selectively latching a random set of wordlines corresponding to aid address signals; and, simultaneously providing an operational voltage on said set of wordlines to accomplish a predetermined operation responsive to said procedure signal.

30. The method of claim 29 wherein said flash memory includes a plurality of wordline latches each coupled to one of said wordlines, said method further comprising the steps of:

receiving a plurality of second address signals:

decoding said second address signals; and simultaneously latching a second random set of wordlines corresponding to said second address signals.

31. The method of claim 30, further comprising the step of:

resetting said latching steps in response to a read signal.

32. The method of claim 30, further comprising the step of:

controlling voltage to said latches to supply said latches with operational voltages such that the maximum voltage differential applied to a single transistor is 10 V.

33. The method of claim 29, further comprising the step of:

controlling voltage to said latches to supply said latches with operational voltages such that the maximum voltage differential applied to a single transistor is 10 V.

34. The method of claim 29, further comprising the steps of:

receiving a suspend signal;

suspending a first operation responsive to said suspend signal; and activating a second operation responsive to said suspend signal.

35. The method of claim 34, wherein:

said step of suspending a first operation is performed by suspending one of a program operation and erase operation by deactivating a first output control line; and said step of activating a second operation is performed by activating a read operation by activating a second output control line.

36. The method of claim 34, wherein:

said step of suspending a first operation is performed by suspending one of a program operation and erase operation by deactivating a first output control line to a first bank of flash transistors; and said step of activating a second operation is performed by activating a read operation by activating a second output control line to a second bank of flash transistors.

* * * * *